(12) United States Patent
Cerezo

(10) Patent No.: US 6,580,069 B1
(45) Date of Patent: Jun. 17, 2003

(54) ATOM PROBE

(75) Inventor: Alfred Cerezo, Oxfordshire (GB)

(73) Assignee: ISIS Innovation Limited, Oxfordshire (GB)

( * ) Notice: Subject to any disclaimer, the term of this patent is extended or adjusted under 35 U.S.C. 154(b) by 0 days.

(21) Appl. No.: 09/508,912

(22) PCT Filed: Sep. 4, 1998

(86) PCT No.: PCT/GB98/02678

§ 371 (c)(1), (2), (4) Date: Nov. 16, 2000

(87) PCT Pub. No.: WO99/14793

PCT Pub. Date: Mar. 25, 1999

(30) Foreign Application Priority Data

Sep. 16, 1997 (GB) .............................................. 9719697

(51) Int. Cl.$^7$ .............................................. H01J 37/285
(52) U.S. Cl. .................. 250/287; 250/309; 250/423 F; 250/282; 250/288
(58) Field of Search ................ 250/287, 309, 250/423 F, 282, 288

(56) References Cited

U.S. PATENT DOCUMENTS 5,440,124 A * 8/1995 Kelly et al. .................. 250/287
5,614,711 A * 3/1997 Li et al. ....................... 250/282
6,207,951 B1 * 3/2001 Yamauchi et al. ........... 250/251

FOREIGN PATENT DOCUMENTS

JP          7-043373      7/1993

OTHER PUBLICATIONS

Osamu Nishikawa, Masahiro Kimoto, "Toward a scanning atom probe—computer simulation of electric field," Applied Surface Science 76/77 (1994) 424–430, reprinted from Elsevier Science B.V., 1994.

* cited by examiner

*Primary Examiner*—John R. Lee
*Assistant Examiner*—Zia R. Hashmi
(74) *Attorney, Agent, or Firm*—Drinker Biddle & Reath LLP

(57) ABSTRACT

The atom probe, which is suitable for use as a scanning atom probe, has a two-part counter electrode (10) and a detector (20) positioned behind the counter electrode. Power supply means are also provided for applying a positive dc voltage to a specimen under study and for applying a negative voltage pulse to a first plate (11) of the counter electrode while a second plate (12) and the detector (20) are held to ground. The two plates (11, 12) of the counter electrode are electrically isolated from one another with the plate (11) nearest the specimen shaped so that the electric field generated between the specimen and the plate (11) is concentrated at an individual microtip (31a) on the surface of the specimen. In use, the voltage pulse $V_p$ applied to the first plate is shaped such that there is a substantially constant maximum negative voltage for a period of time dependent upon the separation of the specimen from the first plate. In this way ions produced at the microtip coast from the first plate (11) to the detector (20). This results in a narrow spread of kinetic energies of ion reaching the detector (20) which in turn provides improved mass resolution.

15 Claims, 2 Drawing Sheets

ATOM PROBE

The present invention relates to an atom probe and in particular to a scanning atom probe.

A known design of an atom probe is described in an article by A. Cerezo et al published in *EMSA* Bulletin 20:2 November 1990. The design essentially comprises a counter electrode and a detector located some distance (e.g. approx. 600 mm) behind the counter electrode. At least a part of the counter electrode is adapted (e.g. by having a hole formed therein) to permit the through-passage of ions. A sample to be analysed, in the form of a sharply pointed needle of end radius approximately 20–100 nm, is brought in front of the counter electrode so as to be substantially aligned with that part of the counter electrode which is adapted to permit the through-passage of ions. By applying a large positive voltage between the microtip and the counter electrode a sufficiently large electric field can be generated at the needle end to ionise exposed atoms thereon. The ions thus formed evaporate, leave the needle and are then accelerated towards the counter electrode. The ions which move towards that part of the counter electrode which is adapted to permit the through-passage of ions, continue beyond the electrode to the detector.

It is possible in theory to identify an ion removed from a sample using time-of-flight mass spectrometry. This requires knowledge of the ion's time of flight, $t_f$, which is typically a few microseconds, in addition to the ion's kinetic energy. In order to know the time of flight accurately, it is necessary to know both when the ion left the needle and when it arrived at the detector with a high degree of precision. In order to determine accurately when the ions leave the needle end a very short positive voltage pulse $V_p$ is generally applied to the sample on top of a positive dc biasing voltage, $V_s$, which is continuously applied to the sample. Alternatively, a short negative voltage pulse may be applied instead to the electrode. The dc voltage $V_s$ is less than but near to that required to produce an electric field strength at the needle end which is sufficient to cause ionisation and evaporation of exposed or prominent atoms on the needle end. When the voltage pulse $V_p$ is applied to the sample, the electric field strength is increased, at a well defined point in time for a well defined duration, such that ionisation and evaporation occurs. In this way the point in time at which an ion leaves the sample can be determined. However, the use of a voltage pulse gives rise to the situation that ions are accelerated away from the needle in a time-varying electric field which results in a broad spread in the kinetic energies of the ions travelling to the detector. Thus the kinetic energy of individual ions leaving the sample and travelling to the counter electrode is not well defined.

The present invention seeks to provide an atom probe which provides a narrow spread of kinetic energies of ions so as to provide improved mass resolution of detected ions. In a preferred embodiment the kinetic energy is substantially defined by the voltage potential between specimen and detector.

According to the present invention, there is provided an atom probe for analysing the surface of a specimen comprising a detector; a counter electrode which includes a first plate and at least one second plate located between the first plate and the detector; control and power supply means connected to the first and second plates for maintaining at least one second plate at a substantially constant voltage with respect to the detector and for supplying a negative voltage pulse to the first plate wherein the control and supply means is adapted to supply a voltage pulse which has a substantially constant or slowly varying maximum negative voltage for a period of time dependent on the separation of at least one second plate from the specimen.

Preferably, the first plate is maintained at substantially the same voltage as the at least one second plate other than when the negative voltage pulse is applied to the first plate when its voltage preferably falls below that of the at least one second plate.

Furthermore, ideally the at least one second plate and the detector are held at substantially the same voltage so that ions passing the first electrode are decelerated and then coast towards the detector.

Also, a preferred separation between the first and second plates is less than 250 µm. This has the advantage of enabling the first plate to be located further than 1 µm from the tip of the specimen to be analysed (preferably about 5–30 µm) while still enabling ions leaving the specimen, when accelerated by a potential difference of approximately 10 kV, to reach the second plate within about 1 nanosecond. This is approximately the preferred accuracy within which the time of evaporation needs to be known in order to prevent significant loss of resolution.

The specimen may take the form of a sharply pointed needle of end radius approximately 20–100 nm or a substantially flat surface having one or more microtips thereon.

By maintaining the potential at the second plate substantially constant during the travel time of an ion between the needle end or microtip and the at least one second plate (or by varying the potential only relatively slowly during this time, typically less than 1 ns), the final kinetic energy of the ion will not depend strongly on the exact value of the voltage on the first plate at the time of evaporation. As a result, the spread of kinetic energies of ions accelerated in this way is relatively narrow. Any changes in the voltage of the first plate after an ion has passed the second plate will not affect the kinetic energy of the ion.

The control and supply means preferably incorporates at least one solid-state switch that provides the voltage pulse to the first plate. The use of one or more solid-state switches enables a voltage pulse to be provided which has a relatively smooth rise and fall and a plateau duration of approximately 1 ns. Such a voltage pulse is well adapted for use with the atom probe of the present invention.

The detector is preferably position sensitive such that a three dimensional analysis of the specimen may be undertaken.

Furthermore, the counter electrode is preferably mounted on drive means to enable the counter electrode to be moved relative to the specimen so as to permit alignment of the counter electrode with a sharply pointed specimen and/or to permit a number of different microtips on a substantially flat surface to be analysed sequentially. In the latter case, the atom probe is able to function as a scanning atom probe. Alternatively, the specimen may be moved with respect to a fixed/movable counter electrode to afford relative movement.

At least the first plate of the counter electrode may be generally cone-shaped in the direction away from the detector. This enables the electric field generated at the specimen to be concentrated at only a single microtip, thus preventing interference from any nearby microtips.

The counter electrode may conveniently be formed from two separately fabricated plates which are then assembled together with insulating spacers which provide insulation between the plates, ensure a suitable separation between the plates and assist in the positioning and relative alignment of the plates. Alternatively, the counter electrode may be integrally formed using a combination of metal and insulator layers on a shaped substrate.

In order that the present invention may be better understood, one embodiment thereof will now be described by way of example only and with reference to the accompanying drawings, in which.

Figure 1:
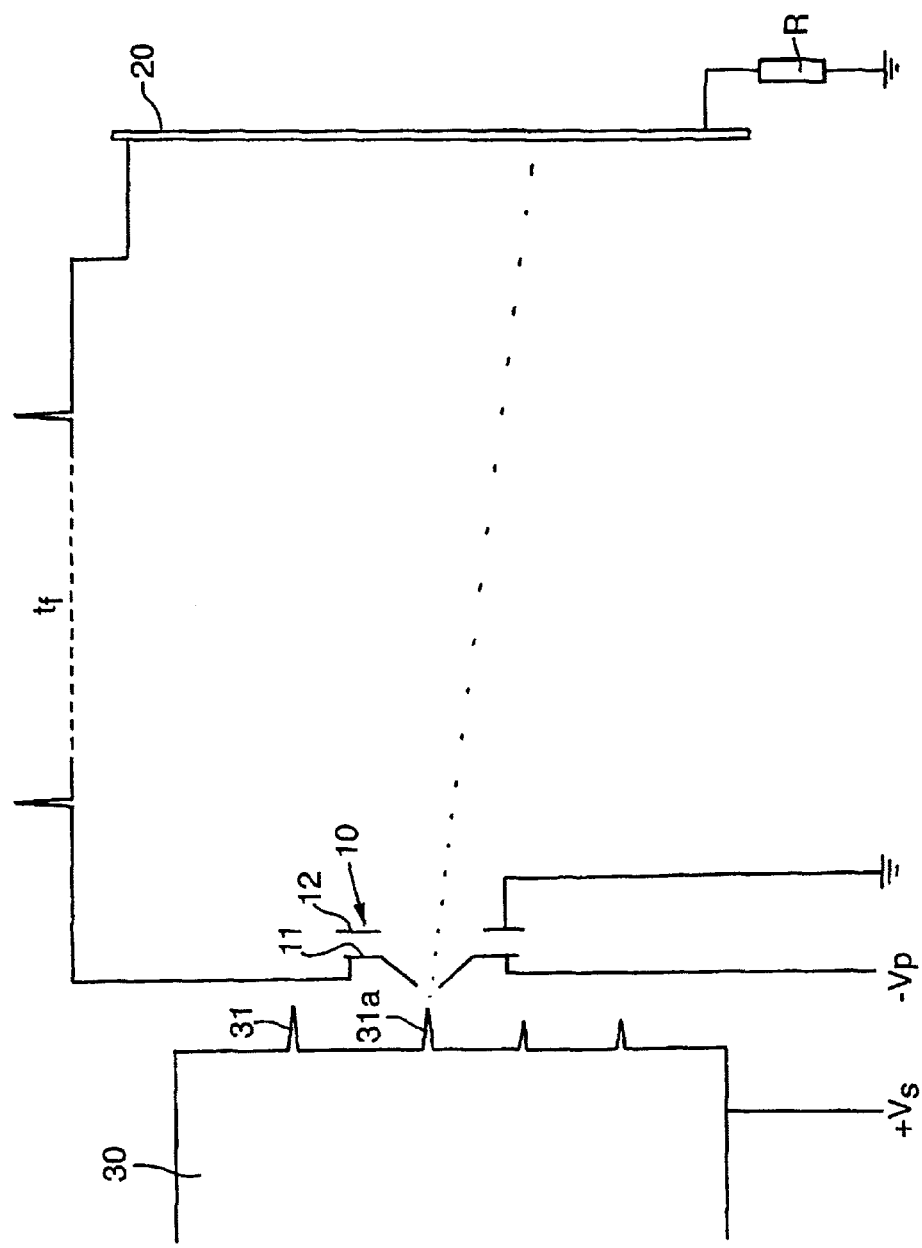
FIG. 1 is a schematic diagram of an atom probe in accordance with the present invention.
Figure 2:
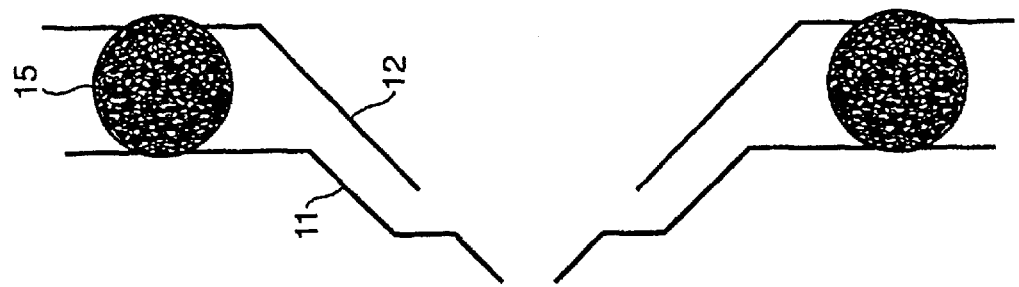
FIG. 2 is a schematic diagram of a counter electrode suitable for use in the present invention.

Referring to FIGS. 1 and 2 in particular, the atom probe essentially consists of a two-part counter electrode 10 and a detector 20 located behind the counter electrode. A suitably prepared specimen 30 having a number of microtips 31, 31a formed thereon, is mounted in front of the counter electrode 10 and the entire assembly is mounted in a vacuum.

The counter electrode 10 is formed from a first plate 11 and a second plate 12 which are electrically isolated from one another by suitable insulating spacing elements 15 (see FIG. 2). At least the first plate 11 is shaped with truncated frusto-conical surfaces at an angle away from the plane of the detector 20, so that the electric field generated between the specimen 30 and the first plate 11 is concentrated at only one microtip 31a, through suitable alignment between the specimen 30 and the counter electrode 10.

A positive dc voltage $V_s$ is applied to the specimen (which is formed from a conductive or semi-conductive material to be analysed) by the control and power supply means (not shown). The first plate 11 is held at approximately zero volts until a negative voltage pulse $V_p$ is applied. When the first plate 11 is at approximately zero volts the electric field generated at the respective microtip 31a is less than, but near to, the electric field strength at which exposed or prominent atoms on the microtip are liable to become ionised, and the ions thus formed desorbed or evaporated and accelerated towards the counter electrode 10.

Figure 3:
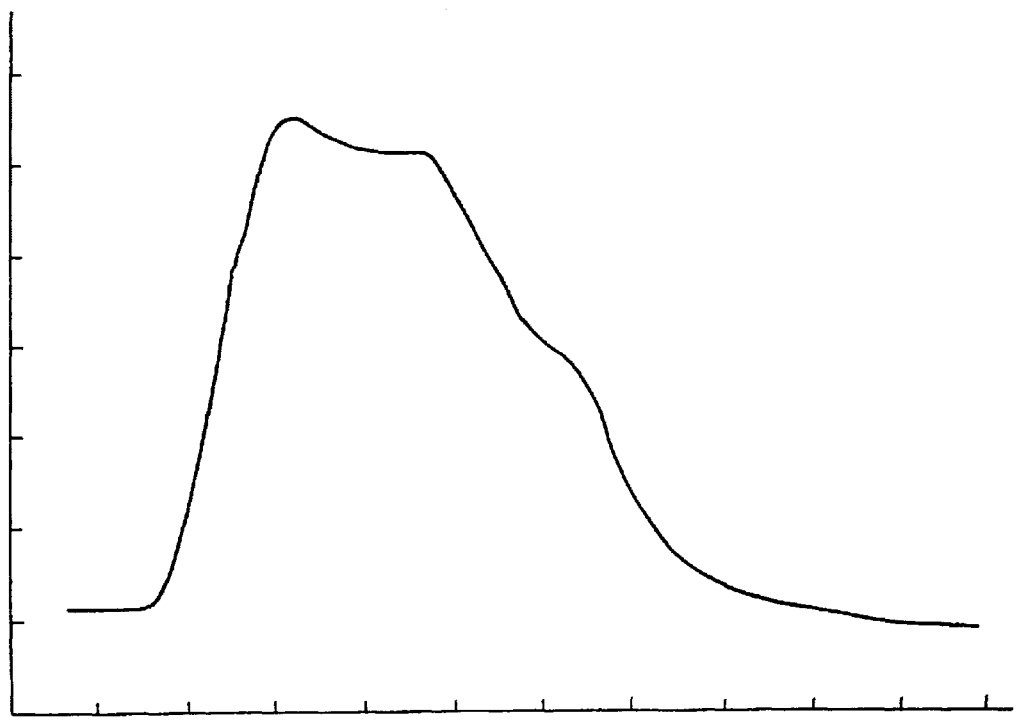
FIG. 3 is a diagram showing the approximate shape of a voltage pulse suitable for use in the present invention.
Figure 4:
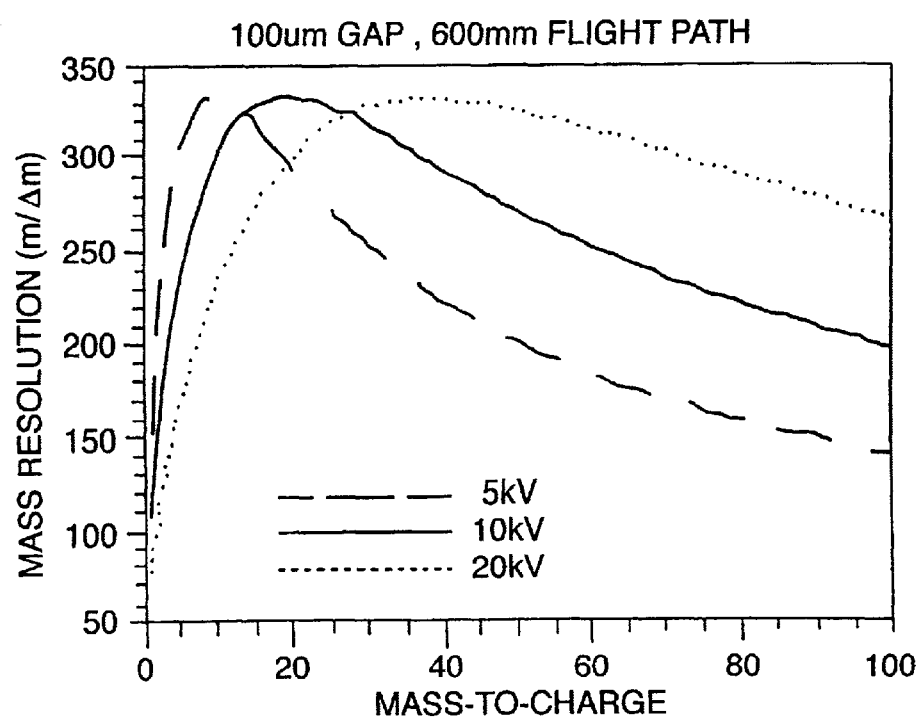
FIG. 4 is a graph of a theoretical mass resolution of ions detected by the atom probe of the present invention plotted against the mass-to-charge ratio of the ions, for different ionising voltages.

The negative voltage pulse $V_p$ is preferably shaped as shown in FIG. 3 with a magnitude of approximately 1–2 kV. The dc voltage $V_s$ applied to the specimen is preferably about 10 kV, although this may be altered considerably (see FIG. 4) to match the conditions of the atom probe and the specimen being analysed. Factors affecting the dc voltage $V_s$ include the dimensions of the microtip, the composition of the specimen, the distance between the specimen and the counter electrode, etc. At around the critical electric field strength (i.e. the electric field strength below which no significant ionisation occurs but above which significant ionisation does occur), a 1–2% change in field strength changes the ionisation rate by a factor of approximately 10. For this reason, appreciable ionisation is substantially restricted to the top 1–2% of the applied voltage. However, since the total applied voltage between the specimen and the first plate is about ten times greater than the voltage pulse, appreciable ionisation can also be said to be primarily restricted to the top 10–20% of the voltage pulse. This represents a short period of time during which the ions could have been formed and evaporated, which therefore defines the time of departure of the ions from the microtip reasonably precisely (i.e. to within a few nanoseconds and preferably to within 2 nanoseconds) which is important to ensure high mass resolution of the ions being detected.

In order to generate a suitably shaped voltage pulse $V_p$ a solid-state switch may be used. Such devices (well known in the art of pulse forming devices per se) are capable of producing high voltage, short duration pulses at a relatively high frequency and the shape of the pulses may be tailored to suit the needs of any particular patent application.

A voltage pulse produced by such a solid-state switch and suitable for use in the present invention is shown in FIG. 3 in which the horizontal divisions each represent 2 nanoseconds, while the vertical scale is arbitrary but linear. Such a pulse has a magnitude of about 1–2 kV, a relatively smooth rise and fall, within the top 20% (by magnitude) of the voltage pulse, and a plateau extending preferably only for about one or two nanoseconds.

The use of the voltage pulse such as that shown in FIG. 3 in combination with the counter electrode 10, where the first 11 and the second 12 plates are located relatively closely together (e.g. about 100 microns apart) enables the majority of ions (those having a sufficiently low mass/charge ratio given the accelerating voltage) formed on the microtip 31a being analysed, to make the journey between the microtip 31a and the second plate 12 in a sufficiently short time (e.g. less than one nanosecond) that the voltage on the first plate 11 remains substantially constant, or varies only slowly, whilst the ions are in transit between the microtip 31a and the second plate 12. Provided the above condition is met, the kinetic energy of ions emerging from the counter electrode 10 primarily depends only on the accelerating voltage between the microtip 31a and the second plate 12 and is substantially independent of the actual voltage between the microtip 31a and the first plate 11 at the time of ionisation. In this way, the long standing problem associated with the spread of energy values of ions produced in a time-varying electric field is substantially overcome.

The second plate 12 and the detector 20 are preferably grounded, such that ions passing from the counter electrode 10 are first decelerated and then coast towards the detector 20 through a zone which is substantially free of any electric fields.

When an ion strikes the detector 20 a small voltage pulse is produced. By monitoring the time of application of the voltage pulse $V_p$ to the first plate 11 and the time of generation of a small voltage pulse by the detector 20 (e.g. with an electronic timer preferably having a time resolution of at least one nanosecond), the time of flight, $t_f$, of an ion or ions between leaving the microtip 31a and striking the detector 20 may be accurately established. Since the kinetic energy of such an ion is well known it is possible to calculate the mass-to-charge ratio of the ion and thus to identify what type of ion has been detected.

Furthermore, as will be well known to a person skilled in the art of atom probes, because the electric field between the microtip 31a and the counter electrode 10 is substantially uniformly divergent, the position on the detector 20 where the ions strike corresponds (in a greatly magnified way due to the divergent electric field) to the original position of the atom from which the ion formed on the microtip 31a.

In order to obtain this positional information, the detector 20 is able to establish and communicate to the control and power supply means whereabouts each ion strikes the detector 20. Suitable detectors 20 for this purpose are known in the art and so their full functioning will not be described here. An example of a suitable detector is described in the article by A. Cerezo et al published in *EMSA* Bulletin 20:2 November, 1990 the contents of which is incorporated herein by reference.

The counter electrode 10 is preferably mounted on drive means (not shown) such as a piezo-drive to enable the counter electrode 10 to be moved relative to the specimen 30. In this way, the counter electrode 10 may be manoeuvred accurately into the correct position in relation to the microtip 31*a* to be analysed and, where the specimen 30 has a number of microtips 31, 31*a* formed thereon, the counter electrode 10 may be moved around so as to analyse more than one microtip successively. Of course, relative movement between the counter electrode 10 and the specimen 30 alternatively could be achieved by mounting the specimen 30 on a suitable drive means instead of or in addition to mounting the counter electrode 10 on a drive means.

The methods of producing a plurality of microtips on a specimen are known in the art and will not be discussed here in detail. A suitable method, however, is to mask the specimen with hard spheres such as diamond spheres and then to etch away the unmasked surface using a technique such as ion milling.

In order to correctly position the counter electrode 10, the atom probe may be operated in a field electron emission mode and a scanned image of the microtips 31, 31*a* may therefore be produced. The counter electrode 10 may then be correctly aligned with each of the microtips to be analysed, before operating the probe as an atom probe, in turn. Alternatively, a laser beam shone through the hole in the counter electrode 10 could permit optical alignment. Other possible methods of relative positioning are known in the art and could also be used.

What is claimed is:

1. An atom probe for analysing the surface of a specimen comprising a detector; a counter electrode which includes a first plate and at least one second plate located between the first plate and the detector; control and power supply means connected to the first and second plates for maintaining at least one second plate at a substantially constant voltage with respect to the detector and for supplying a negative voltage pulse to the first plate wherein the control and supply means is adapted to supply a voltage pulse which has a substantially constant or slowly varying maximum negative voltage for a period of time dependent on the separation of at least one second plate from the specimen.

2. An atom probe as claimed in claim 1, wherein the first plate is maintained at substantially the same voltage as the at least one second plate other than when the negative voltage pulse is applied to the first plate when its voltage falls below that of the at least one second plate.

3. An atom probe as claimed in claim 1, wherein the at least one second plate and the detector are held at substantially the same voltage so that ions passing the first electrode are decelerated and then coast towards the detector.

4. An atom probe as claimed in claim 1, wherein a preferred separation between the first and second plates is less than 250 $\mu$m.

5. An atom probe as claimed in claim 1, wherein the control and supply means incorporates at least one solid-state switch that provides the voltage pulse to the first plate.

6. An atom probe as claimed in claim 5, wherein the at least one solid state switch provides a voltage pulse having a plateau duration of approximately 1 ns.

7. An atom probe as claimed in claim 1, wherein the detector is position sensitive such that a three dimensional analysis of the specimen may be undertaken.

8. An atom probe as claimed in claim 1, wherein the counter electrode is mounted on drive means to enable the counter electrode to be moved relative to the specimen.

9. An atom probe as claimed in claim 1, wherein specimen drive means are provided to enable relative movement of the specimen with respect to the counter electrode.

10. An atom probe as claimed in claim 1, wherein at least the first plate of the counter electrode is generally cone-shaped in a direction away from the detector.

11. An atom probe as claimed in claim 1, wherein the counter electrode is formed from two separately fabricated plates assembled together with insulating spacers therebetween.

12. An atom probe as claimed in claim 1, wherein the counter electrode is formed from a combination of metal and insulator layers on a shaped substrate.

13. A method of measuring the mass of an ion comprising the steps of locating a counter electrode between a specimen and a detector, the counter electrode having a first plate adjacent the specimen and at least one second plate between the first plate and the detector; applying a positive dc voltage to the specimen; applying a negative voltage pulse to the first plate; and determining the mass of an ion evaporated from the specimen in dependence on the time of flight of the ion to the detector and the kinetic energy of the ion, the voltage pulse applied to the first plate having a substantially constant or slowly varying maximum negative voltage for a period of time selected in dependence on the separation of is the at least one second plate and the specimen.

14. A method as claimed in claim 13, wherein the one or more second plates and the detector are held to ground.

15. A method as claimed in claim 13, comprising the further step of moving either or both the counter electrode and the specimen to obtain measurement of ions evaporated from different regions of the surface of the specimen.

* * * * *